United States Patent
Mann et al.

(10) Patent No.: US 10,297,752 B2
(45) Date of Patent: May 21, 2019

(54) RECTIFIER FOR ELECTROMAGNETIC RADIATION

(71) Applicants: Chris W. Mann, Austin, TX (US); Kyle W. Hoover, Austin, TX (US); Gennady Shvets, Ithaca, NY (US)

(72) Inventors: Chris W. Mann, Austin, TX (US); Kyle W. Hoover, Austin, TX (US); Gennady Shvets, Ithaca, NY (US)

(73) Assignee: NANOHMICS, INC., Austin, TX (US)

( * ) Notice: Subject to any disclaimer, the term of this patent is extended or adjusted under 35 U.S.C. 154(b) by 96 days.

(21) Appl. No.: 15/669,915

(22) Filed: Aug. 5, 2017

(65) Prior Publication Data

US 2018/0040820 A1    Feb. 8, 2018

Related U.S. Application Data

(60) Provisional application No. 62/372,287, filed on Aug. 8, 2016.

(51) Int. Cl.
*G01J 5/08*     (2006.01)
*H01L 47/02*    (2006.01)
(Continued)

(52) U.S. Cl.
CPC .......... *H01L 47/023* (2013.01); *G01J 5/0837* (2013.01); *H01L 27/265* (2013.01);
(Continued)

(58) Field of Classification Search
CPC ..... H01L 47/023; H01L 27/265; H01L 47/02; G01J 5/0837; H01Q 1/248; H01Q 1/36; H01Q 15/008; H03K 17/58
See application file for complete search history.

(56) References Cited

U.S. PATENT DOCUMENTS 7,095,027 B1    8/2006    Boreman et al.
7,649,496 B1    1/2010    Silver et al.
(Continued)

FOREIGN PATENT DOCUMENTS

WO     02095832 A2    11/2002
WO    2010010562 A2    1/2010
(Continued)

OTHER PUBLICATIONS

Alhazmi, "Fabrication and Characterization of Metal-Insulator-Metal Diode and Gray Scale Lithography", Masters Thesis, University of Waterloo, Waterloo, Ontario Canada (Nov. 26, 2013).
(Continued)

*Primary Examiner* — Christine S. Kim
(74) *Attorney, Agent, or Firm* — Murphy Strategic IP; George L. Murphy

(57) ABSTRACT

A rectifier is provided for converting an oscillating electromagnetic field into a direct current and comprises an electrically conductive antenna layer configured to absorb electromagnetic radiation, an electrically conductive mirror layer configured to provide an electromagnetic mirror charge of the antenna layer, an electrically insulating tunnel barrier layer positioned between the antenna layer and the mirror layer, and an electronic circuit electrically connected between the conductive mirror layer and the conductive antenna layer. The rectifier employs a metamaterial configuration for room temperature rectification of radiation in regions of the electromagnetic spectrum comprising the MWIR and LWIR regions. Methods for use of the rectifier in rectifying and detecting radiation are described.

24 Claims, 9 Drawing Sheets

(51) Int. Cl.

| | |
|---|---|
| H01L 27/26 | (2006.01) |
| H01Q 1/24 | (2006.01) |
| H01Q 1/36 | (2006.01) |
| H01Q 15/00 | (2006.01) |
| H03K 17/58 | (2006.01) |

(52) U.S. Cl.
CPC ........... *H01L 47/026* (2013.01); *H01Q 1/248* (2013.01); *H01Q 1/36* (2013.01); *H01Q 15/008* (2013.01); *H03K 17/58* (2013.01)

(56) References Cited

U.S. PATENT DOCUMENTS

| | | | |
|---|---|---|---|
| 7,679,057 | B2 | 3/2010 | Gritz et al. |
| 8,071,931 | B2 | 12/2011 | Novack et al. |
| 8,115,683 | B1 | 2/2012 | Stefanakos et al. |
| 8,750,653 | B1 | 6/2014 | Peters et al. |
| 8,847,824 | B2 | 9/2014 | Kotter et al. |
| 9,202,945 | B2 | 12/2015 | Colli et al. |
| 2007/0240757 | A1 | 10/2007 | Ren et al. |
| 2009/0046362 | A1 | 2/2009 | Guo et al. |
| 2011/0062329 | A1 | 3/2011 | Ben-Bassat |
| 2011/0062334 | A1 | 3/2011 | Ben-Bassat |
| 2011/0128541 | A1 | 6/2011 | Grueger et al. |
| 2011/0163920 | A1 | 7/2011 | Cutler |
| 2011/0277805 | A1 | 11/2011 | Novack et al. |
| 2013/0153767 | A1 | 6/2013 | Savoy et al. |
| 2015/0377703 | A1* | 12/2015 | Savoy .................. G01J 1/0429 438/72 |

FOREIGN PATENT DOCUMENTS

| | | |
|---|---|---|
| WO | 2011050272 A2 | 4/2011 |
| WO | 2013093180 A1 | 6/2013 |

OTHER PUBLICATIONS

Li, "Study of Metal-Insulator-Metal Diodes for Photodetection", Masters Thesis, University of Dayton, Dayton, Ohio, USA (May 2013).

Liu et al, "Rectified tunneling current response of bio-functionalized metal-bridge-metal junctions", Biosensors and Bioelectronics, vol. 25, pp. 1173-1178, (Oct. 12, 2009).

Chin et al, "Planar metal-insulator-metal diodes based on the Nb/Nb2O5/X material system", Journal of Vacuum Science & Technology B, vol. 31(5), pp. 051204-1-051204-8, (Aug. 15, 2013).

Esfandiari et al, "Tunable Antenna-Coupled Metal-Oxide-Metal (MOM) Uncooled IR Detector", Proc. of SPIE, vol. 5783, pp. 470-482, (2005).

Kim et al, "Synthesis of large-area multilayer hexagonal boron nitride for high material performance", Nature Communications, vol. 6, Art. No. 8662, (Oct. 28, 2015).

Müller et al, "Epitaxial growth of hexagonal boron nitride on Ag(111)", Physical Review B, vol. 82(113406), pp. 1-4, (Sep. 15, 2010).

Aydin et al, "Broadband polarization-independent resonant light absorption using ultrathin plasmonic super absorbers", Nature Communications, vol. 2, Art. No. 517 (Nov. 1, 2011).

Wu et al, "Design of metamaterial surfaces with broadband absorbance", Optics Letters, vol. 37(3), pp. 308-310, (Jan. 19, 2012).

Grover et al, "Traveling-Wave Metal/Insulator/Metal Diodes for Improved Infrared Bandwidth and Efficiency of Antenna-Coupled Rectifiers", IEEE Transactions on Nanotechnology, vol. 9(6), pp. 716-722, (Jun. 1, 2010).

Donchev et al, "The rectenna device: From theory to practice (a review)", MRS Energy & Sustainability:A Review Journal, vol. 1, pp. 1-34 (2014).

Gadalla et al, "Design, Optimization and Fabrication of a 28.3 THz Nano-Rectenna for Infrared Detection and Rectification", Scientific Reports, vol. 4(4270), pp. 1-9, (Mar. 6, 2014).

Wu et al, "Large-area wide-angle spectrally selective plasmonic absorber", Physical Review B, vol. 84, pp. 0751102-1-0751102-7, (Aug. 1, 2011).

Vaziri et al, "Bilayer insulator tunnel barriers for graphene based vertical hot-electron transistors", Nanoscale, vol. 1, pp. 13096-13104 (2015).

Kim et al, "Synthesis and Characterization of Hexagonal Boron Nitride Film as a Dielectric Layer for Graphene Devices", ACS Nano, vol. 6(10), pp. 8583-8590 (Sep. 12, 2012).

Joshi et al, "Boron Nitride on Cu(111): An Electronically Corrugated Monolayer", NanoLetters, vol. 12(11), pp. 5821-5828, (Oct. 19, 2012).

Britnell et al, "Electron Tunneling through Ultrathin Boron Nitride Crystalline Barriers" NanoLetters, vol. 12, pp. 1707-1710 (Mar. 1, 2012).

Bokdam et al, "Schottky barriers at hexagonal boron nitride/metal interfaces: A first-principles study", Physical Review B, vol. 90, pp. 085415-1-085415-11, (Aug. 13, 2014).

Joshi et al, "Optical rectenna operation: where Maxwell meets Einstein", J Phys D:Applied Phys, vol. 49:265602, pp. 1-8, (May 31, 2016).

Hovel et al, "Modifiation of the Shockley-type surface state on Ag(111) by an adsorbed xenon layer", Surface Science, vol. 477(2001), pp. 43-49, (2001).

Neuhold et al, "Depopulation of the Ag(111) Surface State Assigned to Strain in Epitaxial Films", Phys Rvw Lett, vol. 78(7), pp. 1327-1330, (Feb. 17, 1997).

Paniago et al, "Temperature dependence of Shockley-type surface energy bands on Cu(111), Ag(111) and Au (111)", Surface Science, vol. 336, pp. 113-122 (1995).

Thon et al, "Photon-assisted tunneling versus tunneling of excited electrons in metal-insulator-metal junctions", Appl Phys A, vol. 78, pp. 189-199, (Oct. 31, 2003).

Wilke et al, "Nanometer Thin-Film Ni—NiO—Ni Diodes for 30 THz Radiation", Appl Phys A, vol. 58, pp. 329-341, (1994).

Forster et al, "Systematic studies on surface modifications by ARUPS on Shockley-type surface states", Surface Science, vol. 600(2006), pp. 3870-3874, (May 8, 2006).

Burgi et al, "Noble Metal Surface States:Deviations from Parabolic Dispersion" Surface Science, vol. 447(2000), pp. L157-L161, (2000).

Wessendorf et al, "Electronic Surface Structure of n-ML Ag/Cu(111) and Cs/n-ML Ag/Cu(111) as Investigated by 2PPE and STS", Applied Physics A, vol. 78, pp. 183-188, (Oct. 13, 2003).

Bendounan et al, "Influence of the Reconstruction in Ag/Cu(111) on the Surface Electronic Structure: Quantitative Analysis of the Induced Band Gap", Physical Review B, vol. 72, pp. 075407-1-075407-6, (Aug. 2, 2005).

Mathias et al, "Morphological Modifications of Ag/Cu(111) Probed by Photoemission Spectroscopy of Quantum Well States and the Shockley Surface State", Appl. Phys. A, vol. 82, pp. 439-445, (Dec. 2, 2005).

Ozbay, Plasmonics: Merging Photonics and Electronics at Nanoscale Dimensions, Science, vol. 311, pp. 189-193 (Jan. 13, 2006).

Office Action issued in U.S. Appl. No. 13/329,503, dated Sep. 5, 2014.

Response to Office Action issued in U.S. Appl. No. 13/329,503, dated Sep. 5, 2014 (dated Dec. 19, 2011).

Office Communication issued in U.S. Appl. No. 13/329,503, dated Jan. 29, 2015.

Office Action issued in U.S. Appl. No. 14/718,166, dated Aug. 11, 2015.

Response to Office Action issued in U.S. Appl. No. 14/718,166, dated Aug. 11, 2015 (dated Jan. 11, 2016).

Office Communication issued in U.S. Appl. No. 14/718,166, dated May 2, 2016.

Wu et al, "Ultra-thin, wide-angle perfect absorber for infrared frequencies", Proc. of SPIE, vol. 7029, pp. 70290W-1-70290W-5, (2008).

Avitzour et al, "Wide-angle infrared absorber based on a negative-index plasmonic metamaterial", Physical Review B, vol. 79, 045131 pp. 1-5, (Jan. 23, 2009).

* cited by examiner

RECTIFIER FOR ELECTROMAGNETIC RADIATION

This application claims priority under 35 U.S.C. § 119 to U.S. Provisional Application No. 62/372,287 filed Aug. 8, 2016, which is incorporated by reference herein in its entirety.

STATEMENT REGARDING FEDERALLY SPONSORED RESEARCH

This invention was made in part with government support under DARPA contract number W31P4Q-16-C-0062. The government has certain rights in the invention.

FIELD OF THE INVENTION

The invention disclosed herein relates to the field of devices for rectification of electromagnetic energy. Embodiments of the invention include metal-insulator-metal tunnel diodes, exemplary aspects, and associated methods. In certain aspects of the invention, rectifiers may be full-wave rectifiers. In additional aspects of the invention rectennas are coupled to a diode. Devices of the invention may be useful for energy generation and photodetection.

High-speed and high-sensitivity detection and quantification of electromagnetic radiation typically require expensive epitaxial wafer manufacturing methods and bulky cooling systems. Such detection and quantification is particularly challenging in the midwave infrared (MWIR) and longwave infrared (LWIR) regions of the electromagnetic spectrum (having wavelengths of approximately 1.5 µm to 8 µm (MWIR) and approximately 8 µm to 30 µm (LWIR)), which are useful for enabling chemical fingerprint analysis, visibility through fog and other obscurants, thermal imaging, and detection of directed energy weapons and projectiles. Existing high-speed detectors for use with MWIR and LWIR electromagnetic radiation convert electromagnetic radiation to an electrical signal by way of materials with a small bandgap, which increases the number of thermally-excited carriers and, unless the detector is cooled to cryogenic temperatures, limits sensitivity and increases noise. Other detectors such as bolometers or pyrometers can be tuned for wide spectral bands, including the MWIR and LWIR, but exhibit considerable thermal lag that prohibits the achievement of high-speed detection. High-speed photomultiplier tubes are limited to operational wavelengths shorter than 1.7 µm and are not a wafer-scale technology. Optical rectennas have recently been investigated for the direct transduction of visible, MWIR and LWIR electromagnetic radiation into an electrical signal. The physics of optical rectification is analogous to the techniques used in wireless power transfer, such as radio frequency identification. Optical rectennas are not reliant on a small bandgap or thermal conversion processes, thus leading to lower thermal sensitivity that is primarily limited by Johnson-Nyquist noise. Furthermore, these devices can be chip-scale and operate with GHz-rate response speeds. However, existing rectenna devices exhibit poor zero-bias responsivity, requiring high optical powers in order to operate.

The use of metal-insulator-metal (MIM) diodes with antennas, such as embodiments of the invention described herein, is based on the rectification of the high-frequency antenna currents induced by incident radiation. High quality infrared imaging systems require fast and sensitive detectors, often selective to certain frequencies. Several factors important for producing a useful GHz-bandwidth rectenna include (1) producing a nonlinear junction, like a diode, that operates at the frequency of the electromagnetic radiation; (2) minimizing the junction RC time constant; and (3) maximizing optical access to the junction.

In one embodiment of the invention, a rectifier is provided for converting an oscillating electromagnetic field into a direct current. The rectifier comprises an electrically conductive antenna layer configured to absorb at least 1% of at least one selected wavelength of electromagnetic radiation, an electrically conductive mirror layer, configured to provide an electromagnetic mirror charge of the antenna layer, an electrically insulating barrier layer positioned between the antenna layer and the mirror layer and having a thickness of about 0.3 nm to about 20 nm, and an electronic circuit electrically connected between the conductive mirror layer and the conductive antenna layer, wherein the rectifier is configured to enable electron tunneling through the electrically insulating barrier layer between the electrically conductive antenna layer and the electrically conductive mirror layer. In aspects of the invention, the antenna layer material and the mirror layer material are selected to provide tunneling matrix elements that result in a responsivity factor greater than about 10 $V^{-1}$ for at least one voltage within the range from about −100 mV to about 100 mV.

In some aspects of the invention, the electrically conductive antenna layer comprises an array of electrically connected antennas. The resonance in the antennas produces a strong field enhancement between the mirror layer and the antenna layer, causing electrons to tunnel across the barrier layer. The field enhancement geometry results in a nonlinear tunneling profile. Materials for use in the electrically conductive antenna and mirror layers are selected to provide tunneling matrix elements that result in a responsivity factor greater than about 10 $V^{-1}$ for at least one voltage within the range from about −100 mV to about 100 mV.

In one aspect of the invention, tunneling current from the antenna layer to the mirror layer is enhanced, and the device is configured to enable electron tunneling from the electrically conductive antenna layer, through the electrically insulating barrier layer, and thence to the electrically conductive mirror layer. In another aspect of the invention, tunneling current from the mirror layer to the antenna layer is enhanced, and the device is configured to enable electron tunneling from the electrically conductive mirror layer, through the electrically insulating barrier layer, and thence to the electrically conductive antenna layer. In aspects of the invention, providing a difference in voltage between the antenna layer and the mirror layer or a difference in work function of the materials used in the antenna layer and the mirror layer may enhance electron tunneling in the desired direction and suppress electron tunneling in the opposite direction.

In some embodiments of the invention, the rectifier is configured to absorb at least one wavelength of electromagnetic radiation in the range from about 150 nm to about 1 mm. In some aspects of the invention the at least one wavelength of electromagnetic radiation is in the MWIR region (about 1.5 µm to about 8 µm) or in the LWIR region (about 8 µm to about 30 µm) of the electromagnetic spectrum. In additional aspects of the invention, the rectifier may be configured to absorb at least 1% of any wavelength of electromagnetic radiation within about a one-half octave region of the electromagnetic spectrum from about 150 nm to about 1 mm. In other aspects of the invention, the rectifier may be configured to absorb at least 1% of any wavelength of electromagnetic radiation within about a one-octave region of the electromagnetic spectrum from about 150 nm to about 1 mm. In still further aspects of the invention the rectifier may be configured to absorb at least 1% of any wavelength of electromagnetic radiation within about a two-octave region of the electromagnetic spectrum from about 150 nm to about 1 mm.

In aspects of the invention, materials having a band minimum, a band maximum, or other sharp feature in their density of states, very near the Fermi level (0 V), i.e., from about −100 mV to about 100 mV are preferred for the conductive antenna layer and/or the conductive mirror layer. In some aspects of the invention, the materials are oriented or highly oriented metals. "Highly-oriented" is meant to indicate that the metal grains have a predominant crystalline orientation, even if there are multiple grains that break rotational or translational symmetry. In additional aspects of the invention, the metals are single crystal.

In some aspects of the invention the conductive antenna layer and the conductive mirror layer are made of the same materials. In other aspects of the invention, the conductive antenna layer and the conductive mirror layer are made of different materials. In some embodiments of the invention, at least one or both of the conductive antenna layer and the conductive mirror layer may comprise a metal or a metal alloy. Exemplary materials useful for conductive antenna and/or mirror layers include for example Ag (111), Au, Au—Ag alloy, and other Ag alloys or oriented Ag (111) or an oriented Ag alloy. In additional aspects of the invention, conductive antenna and/or mirror layers comprise metals comprising a thin coating (less than about 10 nm) of Ag. For example, Cu, Al, or Au coated with a layer of Ag less than about 10 nm, are useful in some aspects of the invention.

In some embodiments of the invention, the electrically conductive antenna layer comprises an array of antennas. In some aspects of the invention, a plurality of antennas in an array are electrically connected. In further aspects of the invention, the rectifier comprises a wetting layer between the antenna layer and the electrically insulating barrier layer. In additional aspects of the invention, an antenna array may comprise antennas that are configured for narrow-band and/or broadband absorption of electromagnetic radiation. In some aspects of the invention, therefore, an antenna array may comprise antennas that absorb radiation from multiple distinct bands of the electromagnetic spectrum. In still further aspects of the invention, antennas may be formatted to enhance electric field strength, such as for example with a field-concentrating structure.

In some embodiments of the invention, the electrically insulating barrier layer is physisorbed to at least one of the electrically conductive mirror layer and the electrically conductive antenna layer. In some aspects of the invention the electrically insulating barrier layer is hexagonal boron nitride. In further aspects of the invention, the electrically insulating barrier layer has a thickness that is not greater than about 3 nm.

In some embodiments of the invention, the rectifier is a full-wave rectifier. In certain embodiments of the invention, the rectifier is a diode for use in a photodetector. Embodiments of the invention also include methods for converting an oscillating magnetic field into a direct current.

Other embodiments of the invention are discussed throughout this application. Embodiments described herein are understood to be applicable to all aspects of the invention. It is contemplated that any embodiment discussed herein can be implemented with respect to any method or composition of the invention, and vice versa. Furthermore, compositions of the invention can be used to achieve methods of the invention.

The specification is most thoroughly understood in light of the teachings and references cited within the specification. It should be understood that the drawings, detailed description, and specific examples, while indicating specific embodiments of the invention, are given by way of illustration only, since various changes and modifications within the spirit and scope of the invention will become apparent from this detailed description to those skilled in the art.

Any section headings used herein are for organizational purposes only and are not to be construed as limiting the subject matter described. All documents, or portions of documents, cited in this application, including but not limited to patents, patent applications, articles, books, and treatises, are hereby expressly incorporated by reference in their entirety for any purpose. To the extent publications and patents or patent applications incorporated by reference contradict the invention contained in the specification, the specification will supersede any contradictory material.

BRIEF DESCRIPTION OF THE FIGURES

The following drawings form part of the present specification and are included to further demonstrate certain aspects of the invention. The invention may be better understood by reference to one or more of these drawings in combination with the detailed description of the specification embodiments presented herein.

DESCRIPTION OF CERTAIN EXEMPLARY EMBODIMENTS

Reference will now be made in detail to certain exemplary embodiments of the invention, some of which are illustrated in the accompanying drawings. To assist in understanding the present invention, certain terms are first defined. Additional definitions are provided throughout the application.

The use of the word "a" or "an" when used in conjunction with the term "comprising" in the claims and/or the specification may mean "one," but it is also consistent with the meaning of "one or more," "at least one," and "one or more than one." The use of the term "at least one" in the specification and claims is meant to include "one or more than one", and the use of the term "one or more than one" is meant to include "at least one".

Throughout this application, the term "about" is used to indicate that a value includes a range of plus or minus 10%.

The use of the term "or" in the claims is used to mean "and/or" unless explicitly indicated to refer to alternatives only or the alternatives are mutually exclusive, although the disclosure supports a definition that refers to only alternatives and "and/or." It is also contemplated that anything listed using the term "or" may also be specifically excluded.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

A rectenna is a device that converts an oscillating electric field from an electromagnetic wave into a DC current. For use in the radio frequency/microwave region of the EM spectrum, a rectenna can be fabricated using traditional antennas coupled with diodes and can attain single-frequency conversion efficiencies greater than 90%. In the infrared (IR) region, the diode must respond to frequencies on the order of $10^{15}$ Hz. Metal-insulator-metal tunnel diodes are capable of rectification of optical frequencies, enabling direct energy conversion of optical and infrared electromagnetic waves into current.

In certain embodiments of the invention, the rectifier is a diode for use in a photodetector. High-speed photodetectors can be used for time-resolved measurements where there is a critical electronic bandwidth faster than 1 kHz to up to at least multiple GHz. Examples of such applications include LiDAR, frequency comb spectroscopy, autocorrelation measurements, intensity interferometry measurements, and high-speed transient event imaging.

Figure 1A:
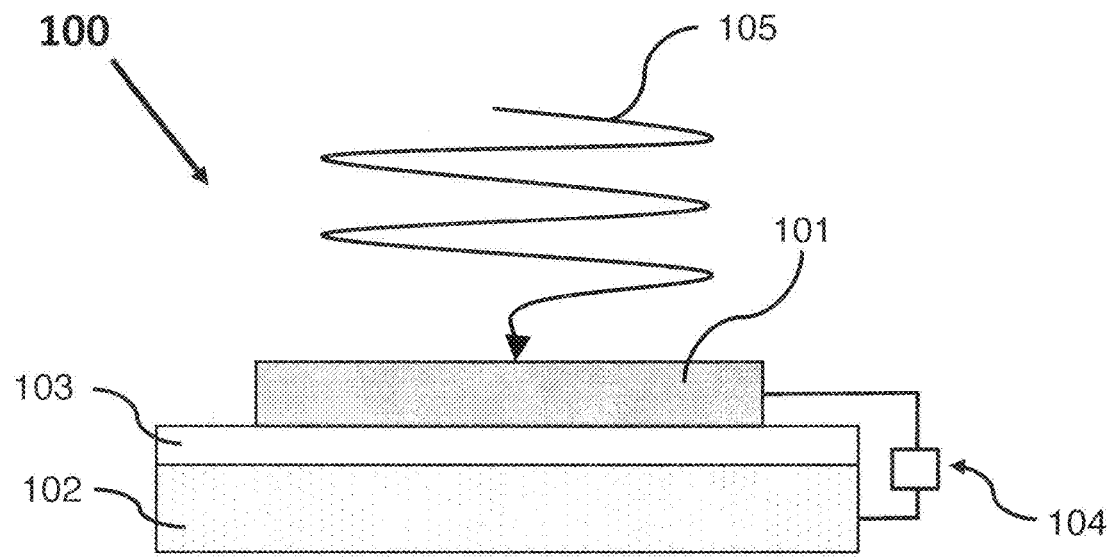
FIG. 1A-1B shows a schematic side-view diagram of one rectifier embodiment 100 of the invention and an energy diagram 110 for an exemplary metal-insulator-metal (MIM) junction currently known in the art and used in a rectenna configuration.
Figure 1B:
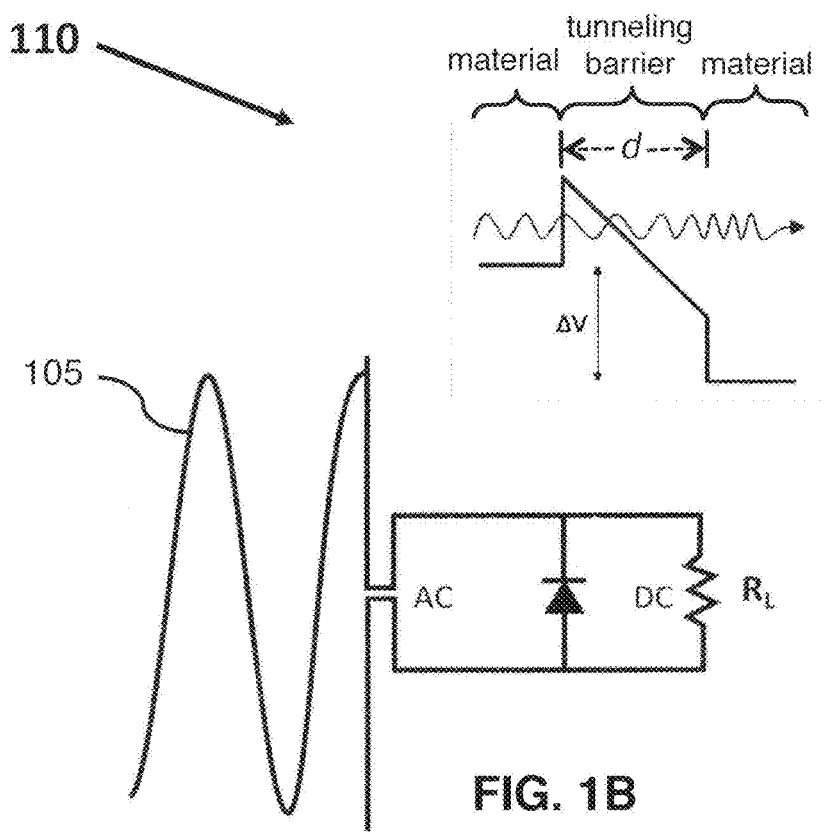

FIG. 1A-1B shows a schematic side-view diagram of one rectifier embodiment 100 of the invention and an energy diagram 110 for an exemplary metal-insulator-metal (MIM) junction currently known in the art and used in a rectenna configuration. In one embodiment of the invention (FIG. 1A), a rectifier 100 for converting an oscillating electromagnetic field into a direct current comprises an electrically conductive antenna layer 101 configured to absorb at least 1% of at least one selected wavelength of electromagnetic radiation 105, an electrically conductive mirror layer 102 configured to provide an electromagnetic mirror charge of antenna layer 101, an electrically insulating barrier layer 103 between antenna layer 101 and mirror layer 102, and an electronic circuit 104 electrically connected between conductive mirror layer 102 and conductive antenna layer 101. FIG. 1B depicts schematically the absorption of electromagnetic radiation by a MIM diode of the current art. The associated energy diagram 110 is depicted at the upper region of FIG. 1B.

Rectifier embodiments of the invention comprise an integrated diode/antenna metamaterial capable of directly rectifying infrared light and providing GHz-rate sensing. The conversion mechanism does not rely on a bandgap, essentially limiting the noise spectrum to Johnson noise. By changing one or more geometric parameter and/or material, the metamaterial antenna layer 101 may be tuned for narrow-band, multi-band, or broadband operation. The tunneling current depends exponentially on the distance (d) between the surfaces of antenna layer 101 and mirror layer 102 that face tunnel barrier layer 103, the voltage difference (ΔV), and the electronic shape of the electrically insulating barrier layer (FIG. 1B), thereby allowing the tunneling properties to be tuned by changing the materials and/or thickness of tunnel barrier layer. (The terms "electrically insulating barrier layer", "barrier layer", "tunnel layer", "tunnel barrier layer", and various combinations of these terms are used interchangeably herein.) When an oscillating electric field from an incident EM wave is present, it may assist with the tunneling of electrons across the tunnel barrier layer, for example by providing an additional electric field across the tunnel barrier layer. By selecting appropriate materials for conductive antenna layer 101 and conductive mirror layer 102, surface treating one or more of antenna layer 101 and mirror layer 102 (e.g., including an alkali layer to reduce the work function or an adhesion layer such as Ti or Cr), and/or by tuning barrier layer 103 such as by including multiple dielectrics in the barrier layer (e.g., one or more than one of $TiO_2$, $Al_2O_3$, NiO, $HfO_2$, or hBN) assisted tunneling can be highly non-linear, resulting in rectification.

These effects may be modeled by using, for example, the transfer matrix method (TMM). In embodiments of the invention, rectifier materials having an energy-dependent tunneling matrix element are useful for further enhancing rectification. As discussed in Tersoff and Hamann, 1985, Phys Rev B, 31(2):805-813, the tunneling current between two materials is given by:

$$I = \frac{2\pi q_e}{\hbar} \Sigma_{\mu,\nu} f(E_\mu)[1 - f(E_\nu - q_e V)]|M_{\mu,\nu}|^2 \delta(E_\mu - E_\nu),$$

where I is the tunneling current to first order, $q_e$ is the charge of an electron, f(•) is the Fermi function, V is the voltage between material 1 and material 2, $M_{\mu,\nu}$ is the tunneling matrix element between quantum states $\psi_\nu$ in material 1 and $\psi_\mu$ in material 2, $E_i$ is the energy of state $\psi_i$ in the absence of tunneling, and δ(•) is the delta function. The tunneling matrix element, $M_{\mu,\nu}$, can depend on a number of factors including the local density of states, the orientation of the quantum states, the spin of the states, and the physical distance between the states.

In previous studies related to rectenna MIM tunnel diodes, this tunneling matrix element has been neglected because most metals that have been investigated have nearly constant densities of states near the Fermi level, allowing this tunneling matrix element to be simplified and reduced to a physical separation parameter. As discussed here, the tunneling matrix element includes at least one other factor, such as the density of states or the available spin states. For an example of a feature in the density of states, the Ag (111) Shockley state provides a band minimum near the Fermi level, which requires including the density of states in the tunneling matrix element in order to approximate the tunneling current. For an example of a spin-dependent tunneling matrix element, magnetic tunnel junctions exhibit increased tunneling currents when their spins are aligned, and an energy-dependent state with a non-trivial spin configuration, such as a topological insulator surface, requires including spin-dependent density of states in the tunneling matrix in order to determine the current across the tunnel junction.

In aspects of the invention, materials having a band minimum, a band maximum, or other sharp feature in their density of states, very near the Fermi level (0 V), i.e., from about −100 mV to about 100 mV are preferred for conductive antenna layer 101 and conductive mirror layer 102. In some aspects of the invention, each of the antenna layer 101 and the mirror layer 102 comprise a metal or a metal alloy. In additional aspects of the invention, the materials are oriented or highly oriented metals. "Highly-oriented" is meant to indicate that the metal grains have a predominant crystalline orientation, even if there are multiple grains that break rotational or translational symmetry. In additional aspects of the invention, the metals are single crystal. One example of a material useful in embodiments of the invention for one or more of antenna layer 101 and mirror layer 102, is Ag (111) with a sharp feature in its density of states near zero bias. Other exemplary materials include Au, Au—Ag alloy, and other Ag alloys. In additional aspects of the invention, a metal comprising a thin coating (less than about 10 nm) of Ag, such as for example only, Cu, Al, or Au having a layer of Ag less than about 10 nm, may be useful for conductive antenna layer 101 and/or conductive mirror layer 102. In some embodiments of the invention, conductive mirror layer 102, comprising for example Ag (111), may be grown epitaxially on silicon wafers.

Several parameters are relevant for optimal tunnel diode properties including asymmetry, nonlinearity, and responsivity. Asymmetry is defined for V≥0 as:

$$f_{asym}(V) = \left|\frac{I(V)}{I(-V)}\right|,$$

where I(V) is the current across a tunnel junction at voltage V. Nonlinearity is defined as:

$$f_{NL}(V) = \frac{dI}{dV}(V) \bigg/ \frac{I(V)}{V}.$$

Responsivity is defined as:

$$f_{RES}(V) = \frac{d^2I}{dV^2}(V) \bigg/ \frac{dI}{dV}(V).$$

Compared to traditional MIM diodes, these parameters can be much higher when including a structure tunneling matrix. For example, the silver Shockley state on Ag (111) provides at least an order of magnitude higher zero bias responsivity than does bulk silver. The band minimum of the Shockley state can be moved through surface alloying, inducing strain from an underlying lattice, or surface adsorbates. In embodiments of the invention, tunneling matrix elements that result in a responsivity factor, $f_{RES}$, greater than about 10 V$^{-1}$ are particularly useful. By using methods of the invention described herein, such as for example modeling using the transfer matrix method, other materials useful for conductive antenna layer 101 and mirror layer 102 may be identified by those with skill in the art.

Surface states, such as the Ag (111) Shockley state, are known to be sensitive to their local electronic environment. Therefore, in some embodiments of the invention, electrically insulating barrier layer 103 may be physisorbed (as opposed to chemisorbed) to one or both of electrically conductive mirror layer 102 and electrically conductive antenna layer 101, so as to preserve the electronic properties of the state. One exemplary material useful in embodiments of the invention for electrically insulating barrier layer 103 is hexagonal boron nitride (hBN). In some embodiments of the invention, electrically insulating barrier layer 103 comprises multiple layers of hBN, such as for example two or three monolayers. In other aspects of the invention, it is preferred that barrier layer 103 comprises a single monolayer of hBN. Based on this disclosure, other materials useful for electrically insulating barrier layer 103 may become apparent to those with skill in the art.

In embodiments of the invention, high zero bias responsivity improves the noise equivalent power (NEP) directly, since detector responsivity, $\beta_v$, scales linearly with the tunnel junction responsivity: $\beta_v(V) = 2 Z_{ant} f_{RES}(V)$, where $Z_{ant}$ is the antenna impedance of an antenna, and voltage scales with incident radiant power, $P_{inc}$, as, approximately $V \sim \sqrt{P_{inc} Z_{ant}}$. A more accurate voltage scaling can be determined through electromagnetic simulations that incorporate the wavelength-dependent properties of antenna material. Antenna impendance is tunable by modifying antenna geometry and the material from which the antenna is made, thereby providing control over the detector responsivity. As there is not always a simple analytical expression for metamaterial antenna impedance, impedance values may be determined computationally or experimentally.

Certain selected materials for use in conductive antenna layer 101 may have stronger nonlinearity or responsivity at a non-zero voltage. Therefore in some aspects of the invention, it may be advantageous to deliberately bias the diode with a voltage. For example, in some aspects of the invention, such as when detecting faint signals, it may be preferable to bias the junction to the point of highest responsivity. In some aspects of the invention, this may introduce an additional source of current noise that is not present in unbiased junctions.

The noise spectrum of an unbiased device depends strongly on $R_{diode}$, the diode resistance: $V_{noise} = \sqrt{4kTR_{diode}B}$, where B is the noise measurement bandwidth. Often, tunnel barriers have large resistances, easily into the gigaohm (GΩ) range, except for very thin barriers. Methods that are compatible with silver and other metals and that are useful for fabricating sub-nm tunnel barrier layers (so as to lower this value into the <kΩ range) are known in the art. Exemplary methods include atomic layer deposition (ALD), epitaxy, and chemical vapor deposition. Hexagonal boron nitride (hBN), which can be grown directly on single-crystal silver, represents an exemplary material for barrier layer 103 that is useful for providing nanometer-scale junctions and protecting surface states (Müller et al., 2010, Phys Rev B, 82:113406-1-113406-4).

Figure 2:
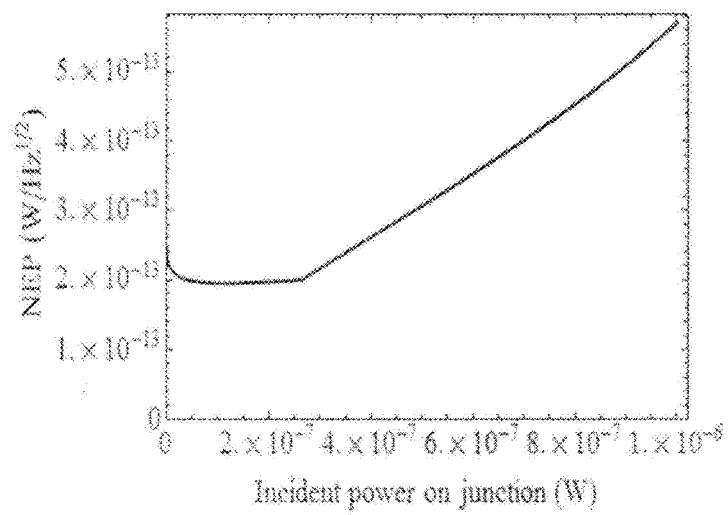
FIG. 2 shows calculated NEP and D* for a silver Shockley state rectenna at room temperature using a 10 μm×10 μm hBN tunnel junction.
Figure 2:
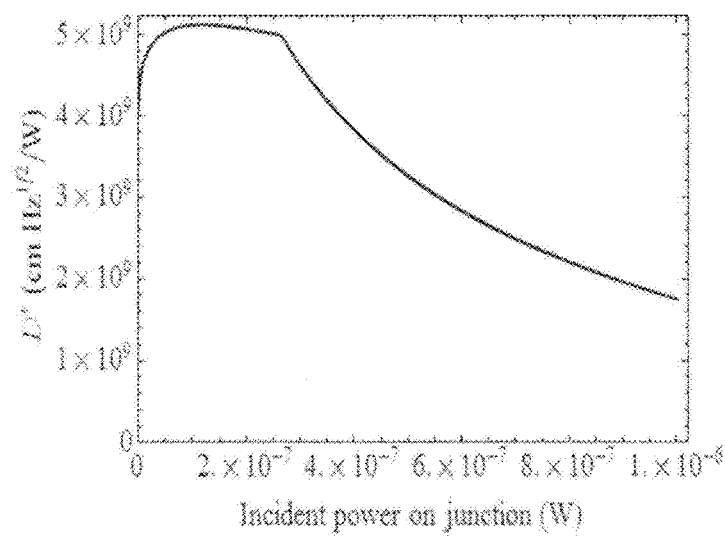

The noise equivalent power (NEP) and specific responsivity, (D*), are given by: $P_{NEP} = V_{noise}/\beta_v$ and $D^* = \sqrt{A_{eff} B}/P_{NEP}$, where $A_{eff}$ is the effective area. Using these equations, the junction and rectifier performance were modeled as shown in FIG. 2. FIG. 2 shows calculated NEP and D* for a silver Shockley state rectenna at room temperature using a 10 μm×10 μm hBN tunnel junction. For low incident powers, the Shockley state is calculated to provide a strongly nonlinear junction, resulting in excellent predicted NEP and D* values. In some aspects of the invention, the NEP may be improved by including, for example, a thermoelectric cooler.

The electronic cutoff frequency for rectifiers of the invention (i.e., the maximum data acquisition rate, not the maximum rectification rate) is given by the RC (resistance× capacitance) constant of the entire tunnel barrier area:

$$f_c = \frac{1}{2\pi RC}.$$

For a tunnel layer resistance on the order of 1 kΩ (1 kiloohm), similar to that expected from an hBN monolayer and a 1 μm×1μm total tunneling area, the cutoff frequency is ~1.8 GHz. The frequency-dependent capacitance is expected to be lower because the field concentrates at the ends of the antennas and is not evenly distributed as for a parallel plate capacitor. The result of this field concentration is to increase the cutoff frequency.

In some embodiments of the invention, the "perfect absorber metamaterial" antenna system, which has both polarization-sensitive and polarization-insensitive configurations, is useful for absorption of radiation. In this type of antenna array, each antenna in electrically conductive antenna layer 101 is in contact with a dielectric, which is also electrically insulating tunnel barrier 103. On the opposite side of tunnel barrier layer 103, electrically conductive mirror layer 102 is present which acts as an electromagnetic mirror, providing the mirror charge of the antenna layer. This configuration results in a plasmonic resonance between the antenna and mirror layers which can be impedance-matched to the incident field, which for some configurations results in >99% absorption. In a "perfect absorber" system, as the field resonates to one side or the other, an electric field is established in the direction from the antenna layer to the mirror layer. The resulting difference in voltage across the barrier allows electrons to tunnel across the gap.

Figure 3:
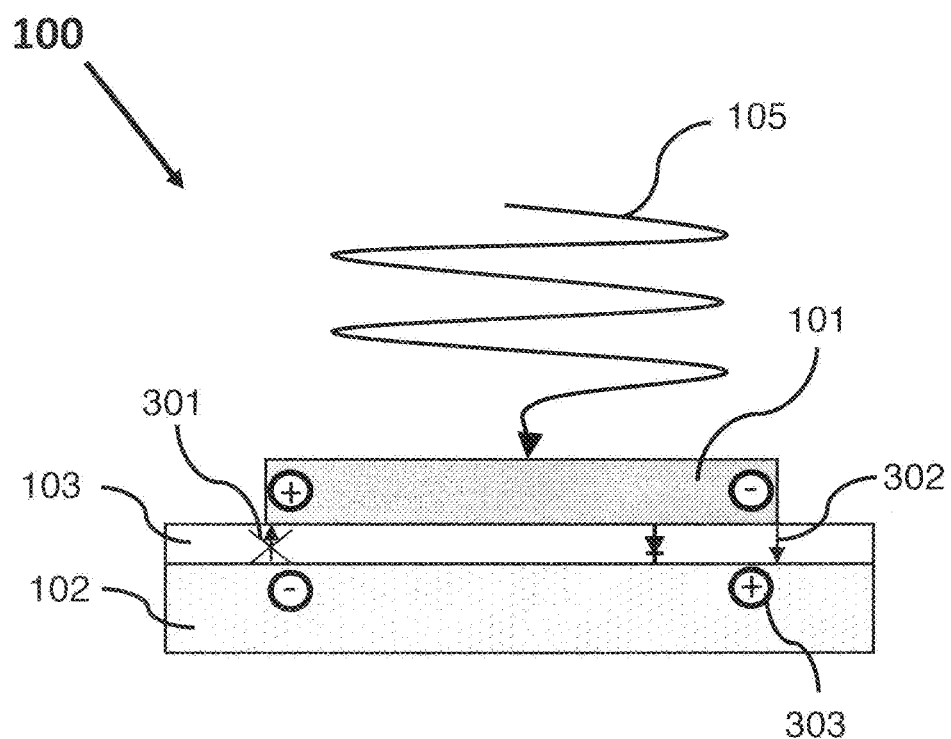
FIG. 3 shows a schematic side-view diagram of the antenna layer-tunnel barrier layer-mirror layer geometry of a full-wave rectifier using an antenna in the "perfect absorber" metamaterial configuration.

FIG. 3 shows a side-view schematic of the antenna layer-tunnel barrier layer-mirror layer geometry of a full-wave rectifier using an antenna in the "perfect absorber" metamaterial configuration. Incident electromagnetic radiation 105 is absorbed by antenna layer 101. Tunneling current is suppressed 301 from mirror layer 102 to antenna layer 101. Tunneling current is enhanced 302 from antenna layer 101 to mirror layer 102, which provides mirror charge 303. This format enables full-wave rectification, unlike standard rectenna concepts, thereby doubling conversion efficiency. Neither the mirror layer nor the electrically insulating barrier layer require nanopatterning. These devices may be fabricated on silicon wafers. As a rough estimate, the antenna elements should measure about $\frac{1}{10}^{th}$ the at least one wavelength to be detected along the axis of electric field component of the electromagnetic radiation that is to be detected.

Figure 4:
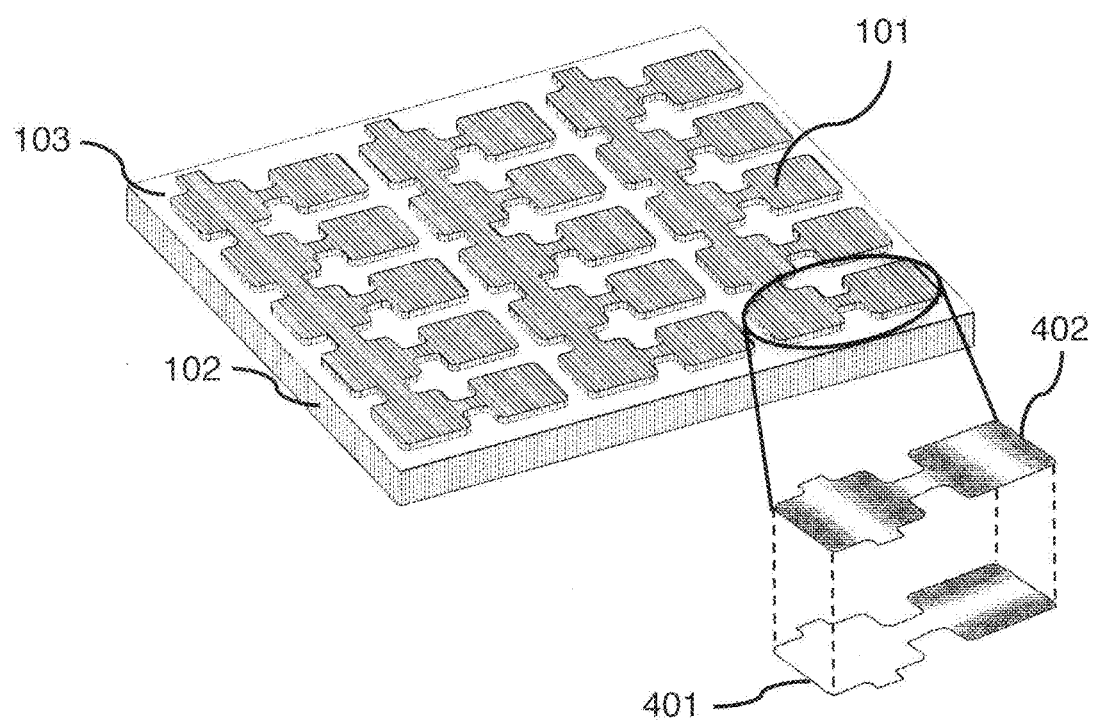
FIG. 4 shows a perspective view of one embodiment of a rectifier of the invention.
Figure 5:
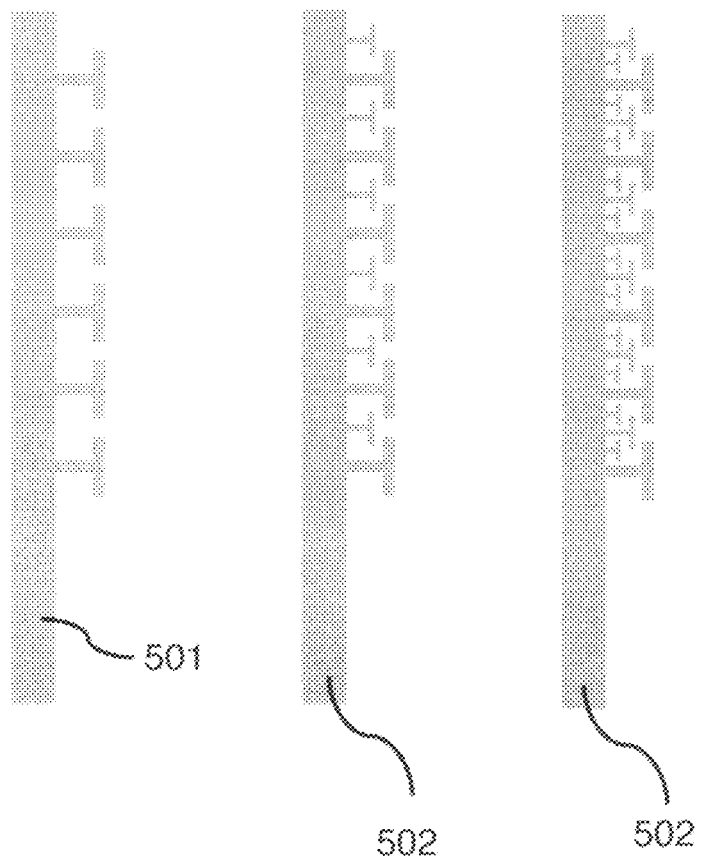
FIG. 5 shows exemplary electrically connected, polarization-insensitive narrow band and broadband antenna arrays in a strip format.

In some embodiments of the invention, electrically conductive antenna layer 103 comprises antennas in an array, which may take any of a variety of configurations including for example a "patch" format or a "strip" format. Typically, patches and strips are present in an array configuration, and each patch or strip is a single element of the antenna. FIG. 4 shows a perspective view of one embodiment of a rectifier of the invention. The structure is a 'perfect absorber metamaterial' configuration with electrically conductive segments connecting an array of patches. The conductive segments result in a different resonance of the antenna patches than if the segments were not present. The inset shows two orthogonal resonances 401, 402 that can be induced by different polarizations of incident electromagnetic radiation. In some embodiments, antennas are arrayed so as to provide position-sensitive absorption, and each antenna or antenna sub-array is connected to an independent electrode for separate measurement. Rectifier embodiments having these configurations of conductive antenna layer 101 are useful for imaging applications, by way of example only. FIG. 5 shows exemplary schematics of electrically connected, polarization-insensitive narrow band 501 and broadband 502 antenna arrays in a strip format.

Figure 6A:
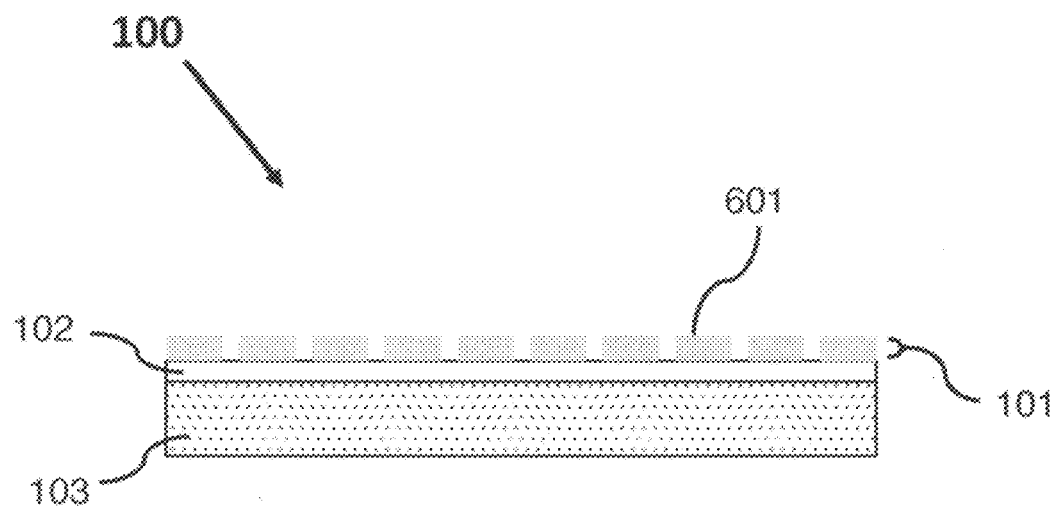
FIG. 6A-B show a side-view schematic diagram of a rectifier embodiment having standard perfect absorber geometry (FIG. 6A) and a sideview schematic diagram of a rectifier embodiment having a field-enhanced perfect absorber geometry (FIG. 6B).
Figure 6B:
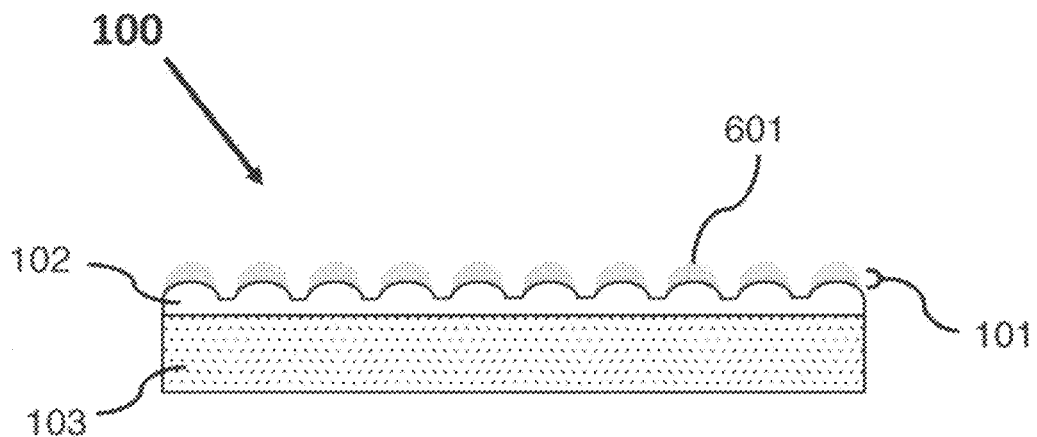

The edges of the resonating antenna element (patch/strip) provide a field enhancement, making it easier for electrons to tunnel from the antenna layer to the mirror layer, resulting in a diode behavior. Additional field enhancement structures (also referred to herein as "field concentrating structure", such as by way of example only, sharpened edges of the antenna structure along the direction of the tunneling, may increase the performance. FIG. 6A shows a side-view schematic diagram of a rectifier embodiment having standard perfect absorber geometry. FIG. 6B shows a sideview schematic diagram of a rectifier embodiment having a field-enhanced perfect absorber geometry. Arrays of antenna patches 601 or strips may be used to increase the area of light capture and increase the strength of the resonance.

In embodiments of the invention, the work functions of the materials used for the conductive antenna layer and conductive mirror layer and the electronic structure of the electrically insulating barrier layer are externally tunable and may influence the electron tunneling process. For example, the layers may be biased with an external voltage applied to the diode, such that electron tunneling is enhanced in the desired direction and suppressed in the opposite direction. In some aspects of the invention, electron tunneling from the antenna layer to the mirror layer is enhanced. In other aspects of the invention, electron tunneling from the mirror layer to the antenna layer may be enhanced, though this configuration does not gain the benefit of the field enhancement.

Figure 7:
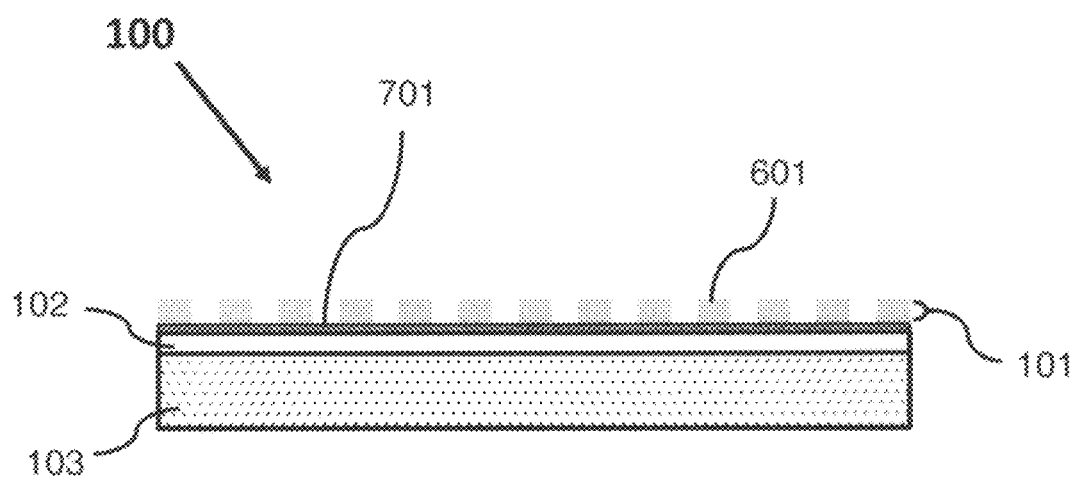
FIG. 7 shows a side view of an embodiment of a metamaterial antenna array having a wetting layer between the antenna layer and the electrically insulating barrier layer (tunnel layer).

FIG. 7 shows a side view of an embodiment of rectifier 100 having a metamaterial antenna array for conductive antenna layer 101 and a wetting layer 701 between conductive antenna layer 101 and electrically insulating barrier layer 103. In some embodiments of the invention, antenna patches 601 in a perfect absorber metamaterial antenna array (i.e., conductive antenna layer 101), may be electrically connected by a metal wetting layer 701, such as for example a 1 nm to 10 nm layer, a graphene overlayer, a transparent conductive layer, nanowires, a conductive surface of a bulk insulating barrier layer such as some topological insulators, or small wires between patches 601.

Other examples of antennas are known in the field of plasmonics. In embodiments of the invention, for rectifying electromagnetic radiation, useful antennas will feature a small junction capacitance, an electrically insulating barrier layer of about 0.3 nm to about 20 nm across which a resonance is coupled, a strong absorption cross section such that at least from about 1% to more than about 99% of the electromagnetic radiation that is to be detected is absorbed, electrically conductive layers (antenna layer and mirror layer), and materials selected such that the tunnel matrix elements result in a responsivity larger than about 10 $V^{-1}$.

Computational methods and analytical methods are known in the art for evaluating antennas. Major classes of solution methods include time domain, frequency domain, and eigenvalue calculations. Computational optimization of antennas is known in the art and can provide anticipated performance. From such computational simulations, the electric fields can be extracted in order to estimate the tunneling currents across the junctions.

In embodiments of the invention, antenna arrays may provide for absorption of electromagnetic radiation over a narrow range of wavelengths (narrow band absorption) or for absorption of electromagnetic radiation over a broad range of wavelengths (broadband absorption). In some aspects of the invention, antenna arrays include antennas or groups of antennas configured for both broadband absorption and narrow band absorption. As mentioned above, FIG. 5 includes examples of both narrow-band and broadband versions of electrically connected antenna arrays.

Figure 8:
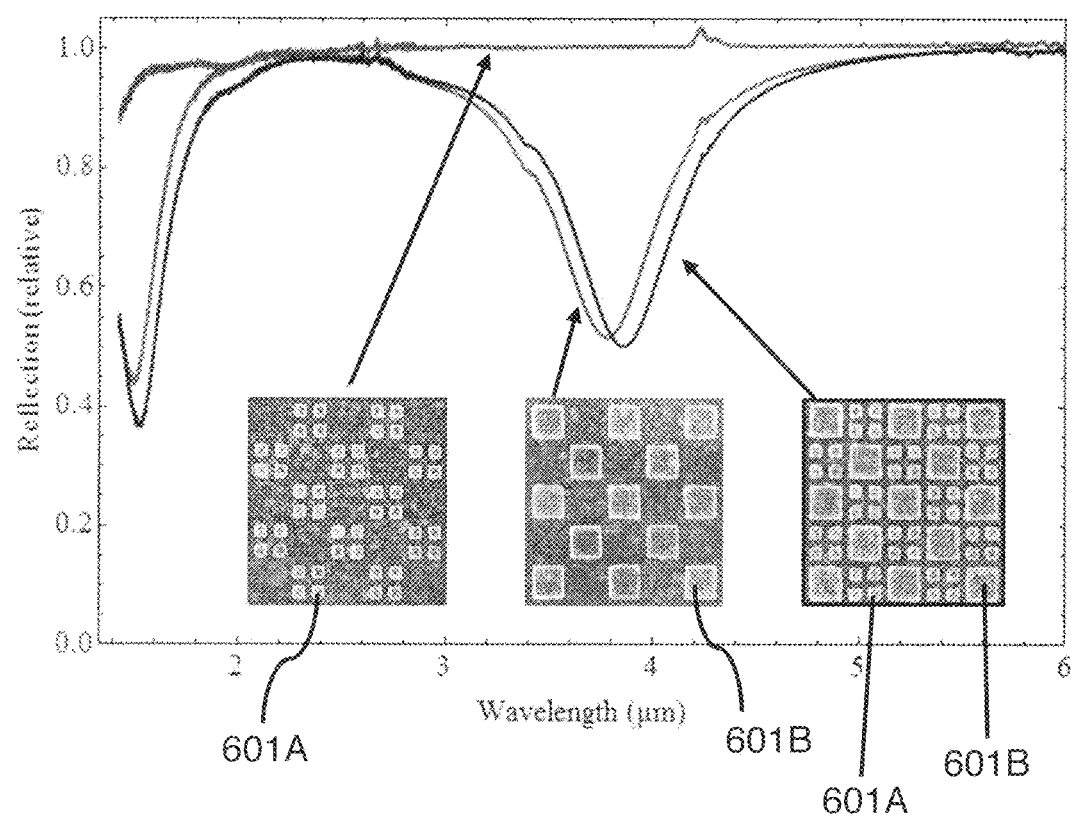
FIG. 8 depicts a reflection spectrum from the FTIR for antenna layers in the 'perfect absorber' configuration having different antenna patches with different dimensions.

FIG. 8 depicts a reflection spectrum from the FTIR for antenna layers in the 'perfect absorber' configuration having different antenna patches with different dimensions. The leftmost array comprises 150 nm patches 601A, the center array comprises 400 nm patches 601B, and the right array (a mosaic) comprises antenna patches of both sizes 601A, 601B. The absorption (1.0 minus Reflection (y-axis)) suggests a sum of the two independent element absorptions (1.0 minus Reflection (y-axis)), indicating relatively weak coupling between elements. The reflection spectrum for each array is indicated by an arrow.

The use of multiple sizes of antenna patch elements 601 enables absorption and rectification of light for narrow bands, multiple bands, or broadband regions of the electromagnetic spectrum. For broadband absorption, one exemplary antenna embodiment comprises antenna elements configured for absorption of more than 1% of all wavelengths of electromagnetic radiation in a region spanning about one octave on the electromagnetic spectrum within the region ranging from about 150 nm to about 1 mm. Another exemplary antenna embodiment for broadband absorption comprises antenna elements configured for absorption of more than 1% of all wavelengths of electromagnetic radiation in a region spanning about two octaves on the electromagnetic spectrum within the region ranging from about 150 nm to about 1 mm. Another exemplary antenna embodiment of the invention, comprises antenna elements configured for absorption of more than 1% of all wavelengths of electromagnetic radiation in a region spanning about one-half octave on the electromagnetic spectrum within the region ranging from about 150 nm to about 1 mm. Mosaics of these antenna elements, similar to those shown in FIG. 8, are one means of increasing the bandwidth of a rectifier of the invention.

As used herein an "octave" on the electromagnetic spectrum refers to an interval or range of values on the spectrum in which the wavelength is doubled. For example, when starting at a wavelength of 1.5 μm, an interval of one octave would end at 3 μm. A wavelength range from 1.5 μm to 6 μm represents 2 octaves. A wavelength range from 1 μm to 1.5 μm represents one-half of an octave.

Figure 9A:
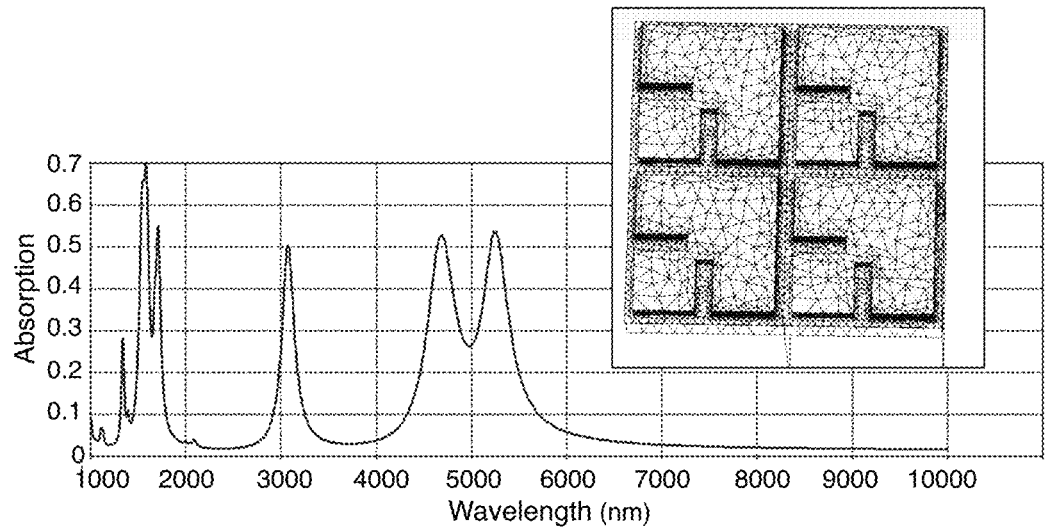
FIG. 9A-9B show the calculated absorption spectra for computationally investigated, broadband 'perfect absorber' antennas having similar, but different, antenna geometries.
Figure 9B:
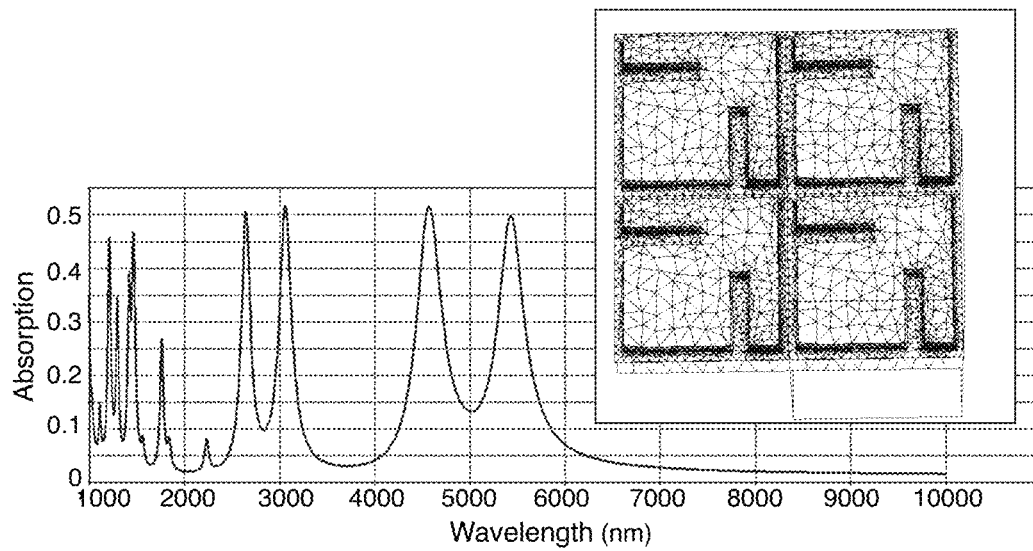

FIG. 9A and FIG. 9B show the calculated absorption spectra for computationally investigated, broadband "perfect absorber" antennas having similar, but different, antenna geometries. The 2×2 unit cells comprise a 50 nm-thick gold antenna element of width 450 nm, two 50 nm wide notches, a 4 nm-thick dielectric tunnel barrier, and a silver mirror layer. These structures are meshed in electromagnetic simulation software, and the calculated absorption spectrum is shown. Antenna element configurations can be investigated in this way, such as through the use of genetic algorithms, to optimize the absorption properties for specialty narrow-band, multi-band, one-octave, or two-octave absorption, by way of example.

In high-speed rectifier embodiments of the invention, the configuration should minimize the capacitance. The capacitance of a metal-insulator-metal configuration is approximately given by the parallel plate capacitor equation: $C=\varepsilon A/d$, where C is the junction capacitance, $\varepsilon$ is the permittivity of the dielectric material at the wavelength of interest, A is the area of the local antenna resonance, and d is the thickness of the barrier. To minimize the barrier capacitance, the area and permittivity must be minimized. The thickness of electrically insulating barrier layer 103 may be increased to reduce the capacitance, but it also plays a key role in the tunneling properties, so thickness should be increased only as needed.

In some embodiments of the invention, antenna layer 101 is specifically designed to select a spectral band of electromagnetic radiation. The spectral band is not limited to any particular region of the electromagnetic spectrum, provided that suitable feature dimensions of the resonance structure are fabricated. Techniques for fabrication are well established in the semiconductor, microelectromechanical systems (MEMS), and metamaterial industries, and include photolithography, electron beam lithography, and nanoimprint lithography (i.e., the smallest feature requirement being in the 10s of nanometers for ultraviolet absorption and the largest being in the millimeter range for microwave radiation). Likewise, the rectifier response is not solely dependent on the absorptivity or band structure of a specific substrate material; rather, the incident radiation is transduced into an electric current by the electrical properties of the tunnel junction. In embodiments of the invention, it is useful that materials used in the tunnel junction electrically insulating barrier layer have carriers that can respond at the frequency of the radiation. Resonance structures that include two or more feature dimensions may be used to absorb multiple wavelengths. Such structures may be prepared on semiconductor wafers, glass slides, and flexible substrates. For single-crystal mirror and/or antenna layers, semiconductor wafers are preferred. For highly oriented layers, less strict requirements are placed on the substrates, provided the processing techniques are used to maximize the orientation, such as control of anneals and substrate wettability. Such techniques are known in the art. For amorphous, polycrystalline, and other disoriented layers, the preparation will depend primarily on the tunnel matrix elements of interest.

In some embodiments of the invention, methods are provided for converting an oscillating electromagnetic field into a direct current using various rectifier embodiments of the invention. In some aspects of the invention, such methods comprise (1) absorbing electromagnetic radiation with a rectifier, the rectifier comprising an electrically conductive antenna layer configured to absorb electromagnetic radiation, an electrically conductive mirror layer configured to provide an electromagnetic mirror charge of the antenna layer, an electrically insulating barrier layer positioned between the antenna layer and the mirror layer, and an electronic circuit electrically connected between the conductive mirror layer and the conductive antenna layer, wherein the rectifier is configured to enable electron tunneling through the electrically insulating barrier layer and wherein the antenna layer and the mirror layer are selected to provide tunneling matrix elements that result in a responsivity factor greater than about 10 $V^{-1}$ for at least one voltage within the range from about −100 mV to about 100 mV; and (2) passing a current, induced by the absorption of the electromagnetic radiation, through the electronic circuit. It is contemplated that embodiments of rectifiers of the invention can be used to achieve methods of the invention, including methods for converting an oscillating electromagnetic field into a direct current using various rectifier embodiments of the invention.

It is specifically contemplated that embodiments of rectifiers of the invention may comprise the elements described herein in various different combinations and numbers. Not all of the elements or types of elements in various rectifier embodiments need be the same or have the same characteristics or parameters. Other objects, features and advantages of the present invention will become apparent from the following detailed description. It should be understood, however, that the detailed description and the specific examples, while indicating specific embodiments of the invention, are given by way of illustration only, since various changes and modifications within the spirit and scope of the invention will become apparent to those skilled in the art from this detailed description.

All references cited herein are incorporated by reference in their entirety. To the extent publications and patents or patent applications incorporated by reference contradict the invention contained in the specification, the specification will supersede any contradictory material.

What is claimed is:

1. A rectifier for converting an oscillating electromagnetic field into a direct current comprising:
   (a) an electrically conductive antenna layer configured to absorb at least 1% of at least one selected wavelength of electromagnetic radiation;
   (b) an electrically conductive mirror layer, configured to provide an electromagnetic mirror charge of the antenna layer;
   (c) an electrically insulating barrier layer, positioned between the antenna layer and the mirror layer and having a thickness of about 0.3 nm to about 20 nm; and
   (d) an electronic circuit electrically connected between the conductive mirror layer and the conductive antenna layer,
   wherein the rectifier is configured to enable electron tunneling through the electrically insulating barrier layer and wherein the antenna layer and the mirror layer are selected to provide tunneling matrix elements that result in a responsivity factor greater than about 10 $V^{-1}$ for at least one voltage within the range from about −100 mV to about 100 mV.

2. The rectifier of claim 1 that is a diode for use in a photodetector.

3. The rectifier of claim 1 wherein the at least one selected wavelength of electromagnetic radiation is from about 150 nm to about 1 mm.

4. The rectifier of claim 3 wherein the at least one selected wavelength of electromagnetic radiation is from about 1.5 µm to about 30 µm.

5. The rectifier of claim 4 wherein the at least one selected wavelength of electromagnetic radiation is from about 1.5 µm to about 8 µm.

6. The rectifier of claim 4 wherein the at least one selected wavelength of electromagnetic radiation is from about 8 µm to about 30 µm.

7. The rectifier of claim 1 wherein each of the antenna layer and the mirror layer comprises a metal or a metal alloy.

8. The rectifier of claim 7 wherein at least one of the antenna layer and the mirror layer comprises oriented Ag (111) or an Ag alloy.

9. The rectifier of claim 7 wherein at least one of the metal or metal alloy comprises a single-crystal or highly oriented metal.

10. The rectifier of claim 7 wherein the antenna layer and the mirror layer comprise a different metal or metal alloy.

11. The rectifier of claim 1 further comprising an electric field concentrating structure.

12. The rectifier of claim 1 wherein the antenna layer comprises an array of antennas.

13. The rectifier of claim 12 wherein a plurality of antennas in the array are electrically connected.

14. The rectifier of claim 1 configured to absorb at least 1% of all wavelengths of electromagnetic radiation in a region spanning about one octave in the electromagnetic spectrum region of about 150 nm to about 1 mm.

15. The rectifier of claim 1 configured to absorb at least 1% of all wavelengths of electromagnetic radiation in a region spanning about two octaves in the electromagnetic spectrum region of about 150 nm to about 1 mm.

16. The rectifier of claim 1 configured to absorb at least 1% of all wavelengths of electromagnetic radiation in a region spanning about one-half octave in the electromagnetic spectrum region of about 150 nm to about 1 mm.

17. The rectifier of claim 1 that is a full-wave rectifier.

18. The rectifier of claim 1 wherein the electrically insulating barrier layer is physisorbed to at least one of the mirror layer and the antenna layer.

19. The rectifier of claim 18 wherein the electrically insulating barrier layer has a thickness that is not greater than about 3 nm.

20. The rectifier of claim 18 wherein the electrically insulating barrier layer comprises hexagonal boron nitride.

21. The rectifier of claim 1 configured to enhance electron tunneling from the antenna layer, through the electrically insulating barrier layer, and thence to the mirror layer.

22. The rectifier of claim 1 configured to enhance electron tunneling from the mirror layer, through the electrically insulating barrier layer, and thence to the antenna layer.

23. The rectifier of claim 1 further comprising a wetting layer positioned between the antenna layer and the electrically insulating barrier layer.

24. A method for converting an oscillating electromagnetic field into a direct current comprising:
   (a) absorbing electromagnetic radiation with a rectifier, the rectifier comprising,
      (i) an electrically conductive antenna layer configured to absorb at least 1% of at least one selected wavelength of electromagnetic radiation;
      (ii) an electrically conductive mirror layer configured to provide an electromagnetic mirror charge of the antenna layer;
      (iii) an electrically insulating barrier layer positioned between the antenna layer and the mirror layer and having a thickness of about 0.3 nm to about 20 nm; and
      (iv) an electronic circuit electrically connected between the conductive mirror layer and the conductive antenna layer,
      wherein the rectifier is configured to enable electron tunneling through the electrically insulating barrier layer and wherein the antenna layer and the mirror layer are selected to provide tunneling matrix elements that result in a responsivity factor greater than about 10 $V^{-1}$ for at least one voltage within the range from about −100 mV to about 100 mV; and
   (b) passing a current, induced by the absorption of the electromagnetic radiation, through the electronic circuit.

* * * * *